United States Patent
Baker

(10) Patent No.: US 11,011,146 B2
(45) Date of Patent: May 18, 2021

(54) MORE EMBODIMENTS FOR COMMON-POINT PICKUP CIRCUITS IN MUSICAL INSTRUMENTS PART C

(71) Applicant: Donald L Baker, Tulsa, OK (US)

(72) Inventor: Donald L Baker, Tulsa, OK (US)

( * ) Notice: Subject to any disclaimer, the term of this patent is extended or adjusted under 35 U.S.C. 154(b) by 0 days.

(21) Appl. No.: 16/995,101

(22) Filed: Aug. 17, 2020

(65) Prior Publication Data
US 2020/0410970 A1 Dec. 31, 2020

Related U.S. Application Data

(63) Continuation-in-part of application No. 16/840,644, filed on Apr. 6, 2020, now Pat. No. 10,810,987, and a continuation-in-part of application No. 16/139,027, filed on Sep. 22, 2018, now Pat. No. 10,380,986, and a continuation-in-part of application No. 15/616,396, filed on Jun. 7, 2017, now Pat. No. 10,217,450, and a continuation-in-part of application No. 14/338,373, filed on Jul. 23, 2014, now Pat. No. 9,401,134.

(60) Provisional application No. 63/052,872, filed on Jul. 16, 2020.

(51) Int. Cl.
  *G10H 3/18* (2006.01)
  *H03G 3/00* (2006.01)
  *H03G 3/20* (2006.01)

(52) U.S. Cl.
  CPC .............. *G10H 3/181* (2013.01); *G10H 3/182* (2013.01); *H03G 3/002* (2013.01); *H03G 3/20* (2013.01); *G10H 2220/505* (2013.01)

(58) Field of Classification Search
  CPC .. G10H 3/181; G10H 3/182; G10H 2220/505; H03G 3/002; H03G 3/20
  USPC .......................................................... 84/726
  See application file for complete search history.

(56) References Cited

U.S. PATENT DOCUMENTS

| | | | |
|---|---|---|---|
| 2,026,841 A | 1/1936 | Lesti | |
| 4,151,776 A | 5/1979 | Stich | |
| 4,175,462 A * | 11/1979 | Simon | G10H 3/182 84/602 |
| 4,305,320 A * | 12/1981 | Peavey | G10H 3/182 84/737 |
| 4,545,278 A | 10/1985 | Gagon | |
| 4,711,149 A * | 12/1987 | Starr | G10H 3/182 84/477 R |

(Continued)

*Primary Examiner* — Christopher Uhlir

(57) ABSTRACT

This invention continues and adds to the embodiments under Non-provisional patent application Ser. No. 16/840,644, adding circuits using small dual-coil humbucking pickups made to mount in the same holes as and replace single-coil pickups. It also develops circuits to match the value of tone capacitors to the lumped inductances of pickup circuits. A mechanical switching system for 3 single-sized humbuckers can produce 21 distinct tonal circuits from 48 different switch combinations, using a 6-way circuit switch and three 2-way mode switches. A digitally-controlled solid-state switching system can avoid the duplicate circuits, and control even more pickups for more tones. With such a switching system, the user can set the order of 2, 21, 120 and 705 distinct tonal circuits for 2, 3, 4 and 5 single-sized humbucking pickups, with expected extensions to larger numbers of pickups, and the caveat from previous work by this inventor that tones tend to bunch together at the warm end, decreasing the number of audibly distinct tones.

11 Claims, 8 Drawing Sheets

(56) References Cited

U.S. PATENT DOCUMENTS

| | | | | | |
|---|---|---|---|---|---|
| 4,817,486 A | * | 4/1989 | Saunders | G10H 1/24 | 84/725 |
| 5,136,919 A | * | 8/1992 | Wolstein | G10H 1/08 | 84/735 |
| 5,311,806 A | * | 5/1994 | Riboloff | G10H 3/182 | 84/728 |
| 5,763,808 A | * | 6/1998 | Thomson | G10H 3/182 | 84/728 |
| 5,780,760 A | | 7/1998 | Riboloff | | |
| 6,121,537 A | * | 9/2000 | Pawar | G10H 3/182 | 84/728 |
| 6,316,713 B1 | * | 11/2001 | Furst | G10H 1/0008 | 84/726 |
| 6,781,050 B2 | * | 8/2004 | Olvera | G10H 3/182 | 84/453 |
| 6,888,057 B2 | * | 5/2005 | Juszkiewicz | G10H 1/0058 | 84/645 |
| 7,276,657 B2 | * | 10/2007 | Bro | G10H 1/18 | 84/723 |
| 7,999,171 B1 | * | 8/2011 | Hamilton | G10H 3/182 | 84/727 |
| 8,479,143 B1 | * | 7/2013 | Baeckler | G06F 30/327 | 716/135 |
| 9,401,134 B2 | | 7/2016 | Baker | | |
| 9,640,162 B2 | * | 5/2017 | Ball | G10H 1/46 | |
| 9,704,464 B1 | * | 7/2017 | Petschulat | G10H 3/186 | |
| 9,747,882 B1 | * | 8/2017 | Micek | G10H 3/186 | |
| 10,217,450 B2 | | 2/2019 | Baker | | |
| 10,380,986 B2 | | 8/2019 | Baker | | |
| 2003/0110508 A1 | * | 6/2003 | Bridgelall | H04N 7/148 | 725/117 |
| 2003/0145715 A1 | * | 8/2003 | Wnorowski | G10H 3/186 | 84/726 |
| 2004/0100944 A1 | * | 5/2004 | Richmond | H04L 45/306 | 370/360 |
| 2004/0210575 A1 | * | 10/2004 | Bean | G06K 9/00442 | |
| 2005/0125756 A1 | * | 6/2005 | Ditlow | G06F 30/392 | 716/124 |
| 2006/0011051 A1 | * | 1/2006 | Aivbrosino | G10H 3/18 | 84/742 |
| 2006/0101340 A1 | * | 5/2006 | Sridhar | H04L 41/12 | 715/734 |
| 2007/0251374 A1 | * | 11/2007 | Armstrong-Muntner | G10H 3/182 | 84/735 |
| 2009/0308233 A1 | * | 12/2009 | Jacob | G10H 1/18 | 84/726 |
| 2010/0124130 A1 | * | 5/2010 | Oh | G11C 7/225 | 365/193 |
| 2010/0208916 A1 | * | 8/2010 | Jacob | G10H 3/186 | 381/104 |
| 2012/0024129 A1 | * | 2/2012 | Ball | G10H 1/18 | 84/602 |
| 2012/0036983 A1 | * | 2/2012 | Ambrosino | G10H 3/183 | 84/731 |
| 2013/0325899 A1 | * | 12/2013 | Mohaban | G06F 16/17 | 707/791 |
| 2014/0150630 A1 | * | 6/2014 | Juszkiewicz | G10H 1/44 | 84/626 |
| 2016/0027422 A1 | * | 1/2016 | Baker | G10H 3/22 | 84/726 |
| 2017/0228389 A1 | * | 8/2017 | Mohaban | G06F 8/20 | |
| 2019/0057678 A1 | | 2/2019 | Baker | | |

* cited by examiner

© 2020 don baker dba android originals LC

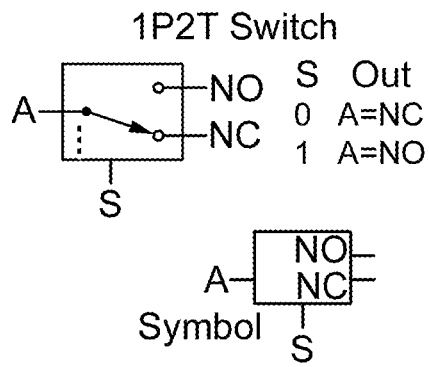
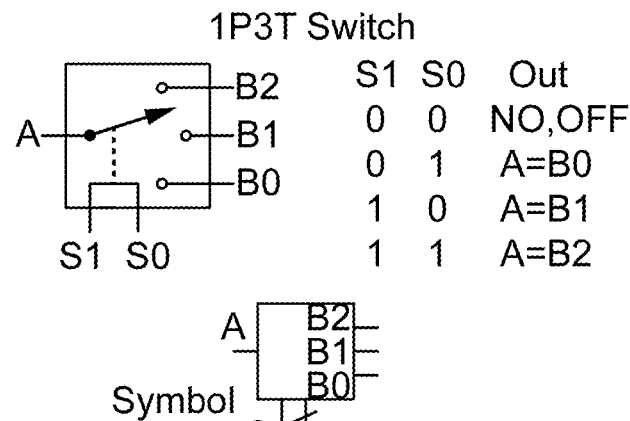
FIG. 3A  FIG. 3B
RELATED ART
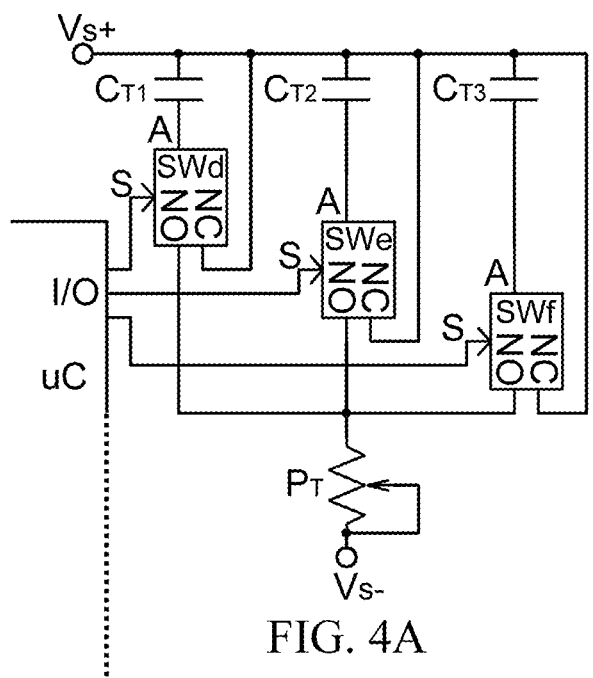
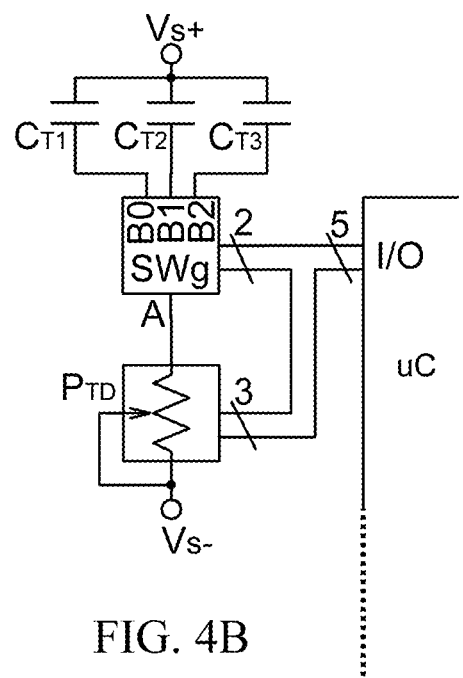
FIG. 4A  FIG. 4B
RELATED ART © 2020 don baker dba android originals LC

US 11,011,146 B2

MORE EMBODIMENTS FOR COMMON-POINT PICKUP CIRCUITS IN MUSICAL INSTRUMENTS PART C

This application, filed 2020 Aug. 17, continues in part U.S. Non-Provisional patent application Ser. No. 16/840,644 (Baker, 2020 Apr. 6), issue fee paid on 2020 Aug. 28 and granted as U.S. Pat. No. 10,810,987 (2020 Oct. 20); and by the invention and development of humbucking pairs of matched single-coil and dual-coil guitar pickups, and common-point connection pickup circuits, this application claims the benefit of precedence by continuation in part of the following U.S. Patents and Patent Applications: U.S. Pat. No. 9,401,134 (Baker, 2016 Jul. 26), U.S. Pat. No. 10,217,450 (Baker, 2019 Feb. 26), U.S. Pat. No. 10,380,986 (2019 Aug. 13); and the precedence of U.S. Provisional Patent Application 63/052,872 (2020 Jul. 16); and is in part related to U.S. Non-Provisional patent application Ser. No. 15/917,389 (Baker, 2018 Jul. 14), Ser. No. 16/752,670 (Baker, 2020 Jan. 26) and Ser. No. 16/812,870 (Baker, 2020 Mar. 9); by this inventor, Donald L. Baker dba android originals LC, Tulsa Okla. USA

COPYRIGHT AUTHORIZATION

Left Blank

The entirety of this application, specification, claims, abstract, drawings, tables, formulae etc., is protected by copyright: © 2020 Donald L. Baker dba android originals LLC. The (copyright or mask work) owner has no objection to the fair-use facsimile reproduction by anyone of the patent document or the patent disclosure, as it appears in the Patent and Trademark Office patent file or records, but otherwise reserves all (copyright or mask work) rights whatsoever.

APPLICATION PUBLICATION DELAY

N/A

CROSS-REFERENCE TO RELATED APPLICATIONS

This application is related to and discloses additional embodiments relating to the patents and applications cited above for benefit, filed by this inventor, Donald L. Baker dba android originals LC, Tulsa Okla. USA. It directly extends U.S. Pat. No. 10,380,986 and U.S. Non-provisional patent application Ser. No. 16/840,644; it is related to U.S. Pat. Nos. 9,401,134 and 10,217,450; it is intended for use with the inventions described in U.S. Pat. No. 9,401,134; it is meant to simulate the effects of inventions in Non-provisional patent application Ser. No. 15/917,389, 16/752,670 and 16/812,870, so as to further evaluate their utility.

STATEMENT REGARDING FEDERALLY SPONSORED RESEARCH OR DEVELOPMENT

Not Applicable

NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENTS REGARDING PRIOR DISCLOSURES BY THE INVENTOR OR A JOINT INVENTOR

All disclosures in the inventor's ResearchGate dot net Projects (user name Donald Baker2), Twitter account (@TSGaxe), web site (TulsaSoundGuitars dot com), and Springer-Nature textbook, "Sensor Circuits and Switching for Stringed Instruments; Humbucking Pairs, Triples, Quads and Beyond" (Springer dot com and Amazon dot com), comply with Patent Law in not prohibiting this NPPA.

TECHNICAL FIELD

This invention describes electro-magnetic string vibration pickups, primarily used in guitars and basses, also applicable to other musical instruments with ferrous strings, such a pianos, primarily to be used in humbucking circuit arrangements in which each pickup responds equally to external electromagnetic fields, otherwise known a hum.

REFERENCES

U.S. Pat. No. 9,401,134, Baker, 2016 Jul. 26, Acoustic-electric stringed instrument with improved body, electric pickup placement, pickup switching and electronic circuit
U.S. Non-provisional patent application Ser. No. 15/917,389, Baker, filed 2018 Jul. 14, Single-coil pickup with reversible magnet & pole sensor
U.S. Pat. No. 10,217,450, Baker, 2019 Feb. 26, Humbucking switching arrangements and methods for stringed instrument pickups
U.S. Pat. No. 10,380,986, Baker, 2019 Aug. 13, Means and methods for switching odd and even numbers of matched pickups to produce all humbucking tones
U.S. Non-provisional patent application Ser. No. 16/752,670, Baker, filed 2020 Jan. 26, Modifications to a lipstick-style pickup housing and core to allow phase reversals in humbucking circuits
U.S. Non-provisional patent application Ser. No. 16/812,870, Baker, filed 2020 Mar. 9, Modular single-coil pickup
U.S. Non-provisional patent application Ser. No. 16/840,644, Baker, filed 2020 Apr. 6, More embodiments for common-point pickup circuits in musical instruments
U.S. NPPA 63/052,872, Baker, filed 2020 Jul. 16, Embodiments of Common-Point Circuits Part C
Baker, Donald L., 2020, Sensor Circuits and Switching for Stringed Instruments, humbucking pairs, triples, quads and beyond, 2020, © Springer Nature Switzerland AG 2020, ISBN 978-3-030-23123-1, available at Springer dot com and Amazon dot com

BACKGROUND AND PRIOR ART

The background and prior art discussion in Non-provisional patent application Ser. No. 16/840,644 applies here.

SUMMARY OF INVENTION

This invention continues and adds to the embodiments under Non-provisional patent application Ser. No. 16/840, 644, adding circuits using small dual-coil humbucking pickups made to mount in the same holes and replace single-coil pickups. It also develops circuits to match the value of tone capacitors to the lumped inductances of pickup circuits. A mechanical switching system for 3 single-sized humbuckers can produce 21 distinct tonal circuits from 48 different switch combinations. A digitally-controlled solid-state switching system can avoid the duplicate circuits, and switch even more pickups for more tones, 120 for 4 pickups and 705 for 5 pickups.

Technical Problems Found and Resolved

In devising Non-provisional patent application Ser. No. 16/840,644, Baker used FIG. 13 of that NPPA to simulate hum-matched single coil guitar pickups by switching to single coils of dual-coil humbuckers. It produced a somewhat dizzying array of 96 possible switch positions with 54 distinct circuits. Using the mean frequency of strumming six strings, FIG. 14 in Non-provisional patent application Ser. No. 16/840,644 shows that most of the circuits produce mean frequencies, and presumably tones, that bunch at the warm end, reducing the effectiveness of the number of choices.

Also, that particular three-humbucker circuit is about as complicated as an electro-mechanical switching circuit can get and still mount all the switches under the pickguard of guitar of common size. Baker had forgotten about dual-coil humbuckers built to mount in a single-coil pickup pickguard hole. Switching among single coils of dual-coil humbuckers produces slight differences in tones because of the physical separation between the North-up (N-up) and South-up (S-up) poles under the strings. One can maintain humbucking and reverse the string signal phase of a single-sized humbucker merely by reversing the leads with a switch, either mechanical or digitally-controlled solid-state analog. That allows more than just three pickups to be mounted under the strings, and more truly duplicates the effects of having matched single-coil pickups with reversible magnets, which will help to evaluate the utility and marketability of such reversible-magnet pickups. This NPPA extends Non-provisional patent application Ser. No. 16/840,644 to include these circuits.

BRIEF DESCRIPTION OF THE DRAWINGS

FIG. 3A-B show FIG. 14 from U.S. Pat. No. 10,380,986 for reference, with the circuit symbols and functional properties of digitally-controlled solid-state switches, a 1P2T switch in FIG. 3A and a 1P3T switch in FIG. 3B.

FIG. 4 A-B show FIG. 16 from U.S. Pat. No. 10,380,986 for reference, with two ways to switch tone capacitors using a micro-controller (uC) to control switches like those in FIGS. 3A-B. FIG. 4A shows an electromechanical tone pot with 3 tone capacitors switched in Parallel with 3 solid-state 1P2T switches, using 3 digital I/O lines from the uC. FIG. 4B shows a digital tone pot, using 3 of the uC I/O lines, with a 1P3T switching 3 tone capacitors individually, using 2 of the uC I/O lines. Combinations of these are possible.

FIG. 10A shows one possible 2 over 2 configuration and FIG. 10B shows one possible 3 over 1 configuration.

DESCRIPTION OF THE INVENTION BY MEANS OF DRAWINGS

Figure 1:
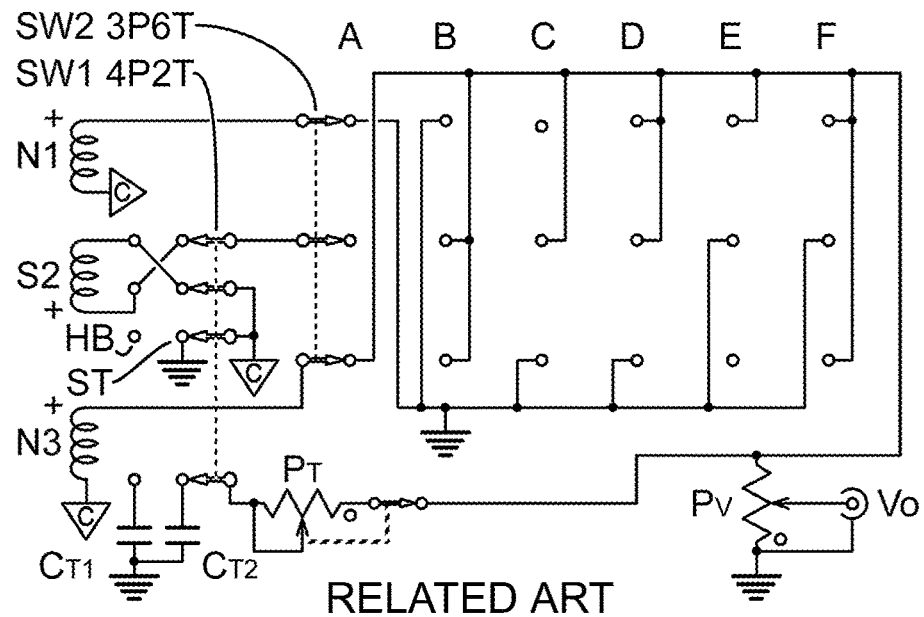
FIG. 1 shows FIG. 8 from Non-provisional patent application Ser. No. 16/840,644 for reference, with the switches renumbered, with a 12-way switching circuit for 3 matched single-coil pickups, using a 6-way circuit switch, SW2, and a 2-way mode switch, SW1, producing all the tones of a 5-way Stratocaster (tm Fender) switch, plus Neck in parallel with Bridge, plus 3 humbucking pairs and 3 humbucking triples.
Figure 8:
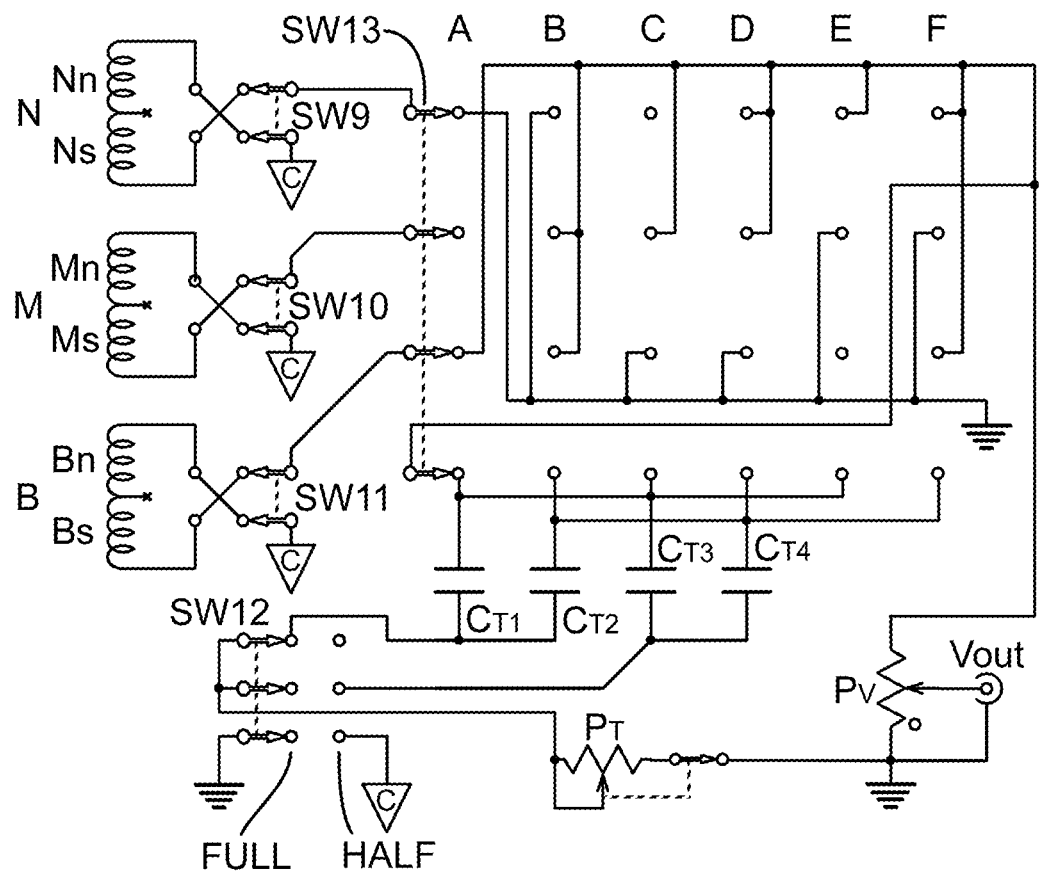
FIG. 8 shows the circuit in FIG. 7 with the order of the tone capacitor and tone pot reversed between the output and ground.

FIG. 1 shows FIG. 8 from U.S. Non-provisional patent application Ser. No. 16/840,644, with the switches renumbered. This circuit is a common-point connection system as described in U.S. Pat. No. 10,380,986 and Non-provisional patent application Ser. No. 16/840,644. It is a switching circuit for a 3-coil Strat-type electric guitar, with matched pickups, where SW1 is a 4P2T mode switch and SW2 is a 3P6T pickup circuit switch. Pickup coils N1, S2 and N3 represent the N-up Neck, S-up Middle and the N-up Bridge pickups, where the "+" signs indicate string signal polarity.

When SW1 is in the left-hand position, HB mode, the hum phases of all the coils are the same at the common-point connection, designated by a Triangle-C, and the circuits produced by SW2 are all humbucking pairs and triples. For this humbucking or HB mode, the circuit output at Vo is shown in Table 1 in the second row. When SW1 is in the right-hand ST mode, the common point is shorted to the low output, which is ground, the leads of S3 are reversed, and SW2 duplicates the standard 5-way Stratocaster switch, plus the neck pickup in parallel with bridge pickup at throw F, as shown in the bottom row of Table 1. SW1 also changes from tone capacitor $C_{T1}$ to $C_{T2}$, going from HB to ST.

TABLE 1

Outputs at Vo in FIG. 1 for SW1 and SW2 settings, where B, M & N represent the string signals for the bridge, middle and neck pickups

| SW2 | A | B | C | D | E | F |
|---|---|---|---|---|---|---|
| SW1 Left (HB) | B − N | (B − M)/2 − N | −(M + B) | (N − M)/2 − B | N + M | (N + B)/2 + M |
| SW1 Right (ST) | B | (B + M)/2 | M | (N + M)/2 | N | (N + B)/2 |

Figure 2:
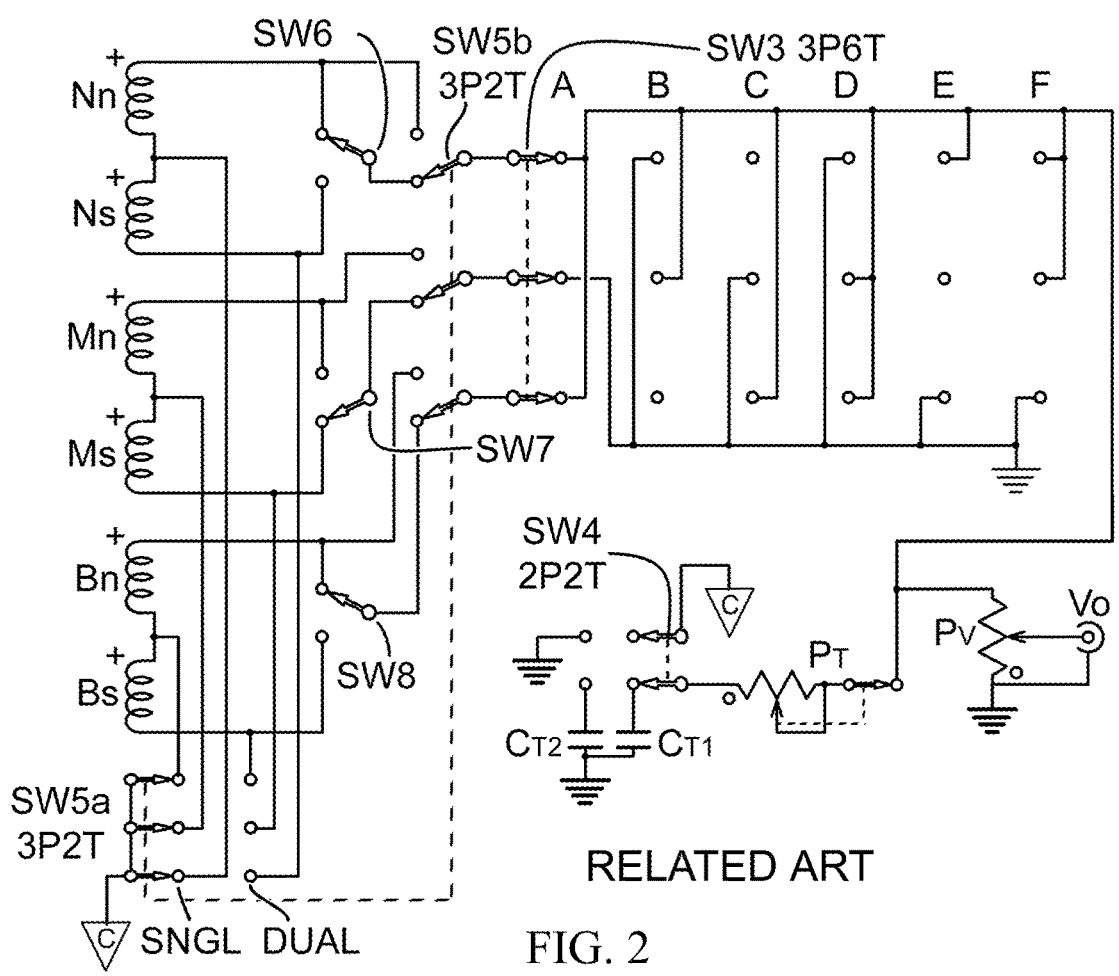
FIG. 2 shows FIG. 13 from Non-provisional patent application Ser. No. 16/840,644 for reference, with the switches renumbered, with a 6-way circuit switch, SW3, a 6P2T mode switch, SW5, a 2P2T mode switch, SW4, and three 1P2T mode switches, SW6 to SW8, producing 54 distinct pickup circuits out of 96 total switch combinations.

FIG. 2 shows FIG. 13 from U.S. Non-provisional patent application Ser. No. 16/840,644, with the switches renumbered, replacing the 3 matched single-coil pickups with 3 matched, center-tapped, dual-coil humbucking pickups. The "+" signs indicate string signal phase. The 3P6T SW3 circuit switch selects pickups circuits, and the mode switches, SW4 to SW8 modify the circuits. SW4 duplicates the two lower poles of SW1 in FIG. 1, choosing the $C_{T2}$ tone capacitor for the ST mode (Triangle-C grounded at left throw) and $C_{T1}$ for the HB mode ("ST" and "HB" not shown), and grounding the common-point connection in the ST mode. SW5 changes the inputs to the circuit switch, SW3, from dual-coil humbuckers (right throw, SW5a and upper throw, SW5b) to single coils (left throw SW5a and lower throw, SW5b) from each humbucker. The mode switches, SW6, SW7 and SW8 choose which coil in each humbucker is used in single-coil mode. The choice determines the phase of the pick vibration signal output, + for N-up and − for S-up. In the dual-coil humbucker mode, each humbucker is presented to SW3 as a single pickup.

The number of throws for SW3 to SW8 are 6, 2, 2, 2, 2 and 2, giving 192 different switch combinations. Non-provisional patent application Ser. No. 16/840,644 has a math mistake, listing the total as 96. But when SW5 is in DUAL mode, SW6, SW7 & SW8 do not function. But as Non-provisional patent application Ser. No. 16/840,644 discloses, there are only 54 distinct circuits, leaving 192−54=138 duplicate circuits. This is a common fault with many electro-mechanical pickup circuit patents. U.S. Pat. Nos. 10,217,450 and 10,380,986 disclose micro-controller (uC) architectures to make switching this kind of circuit more efficient by using an analog signal path and digitally-controlled solid-state analog switches, which can be programmed in the uC not to select any of the duplicate circuits.

FIG. 3A-B shows FIG. 14A-B from U.S. Pat. No. 10,380,986, a functional and symbolic representations of available digitally-controlled analog switches. Such switches exist in many configurations, including surface-mount packages, which are suitable to be used with micro-power microcontrollers such as the Texas Instruments MSP line. This technology makes it possible to run analog-digital guitar circuits for hundreds of hours on small, light batteries.

FIG. 4A-B shows FIG. 16 from U.S. Pat. No. 10,380,986, showing how to use the analog-digital switches in FIG. 3A-B to choose between different tone capacitors, CT1, CT2 & CT3. The Slash-Numbers on the I/O busses show the number of I/O lines in the buss.

Figure 5:
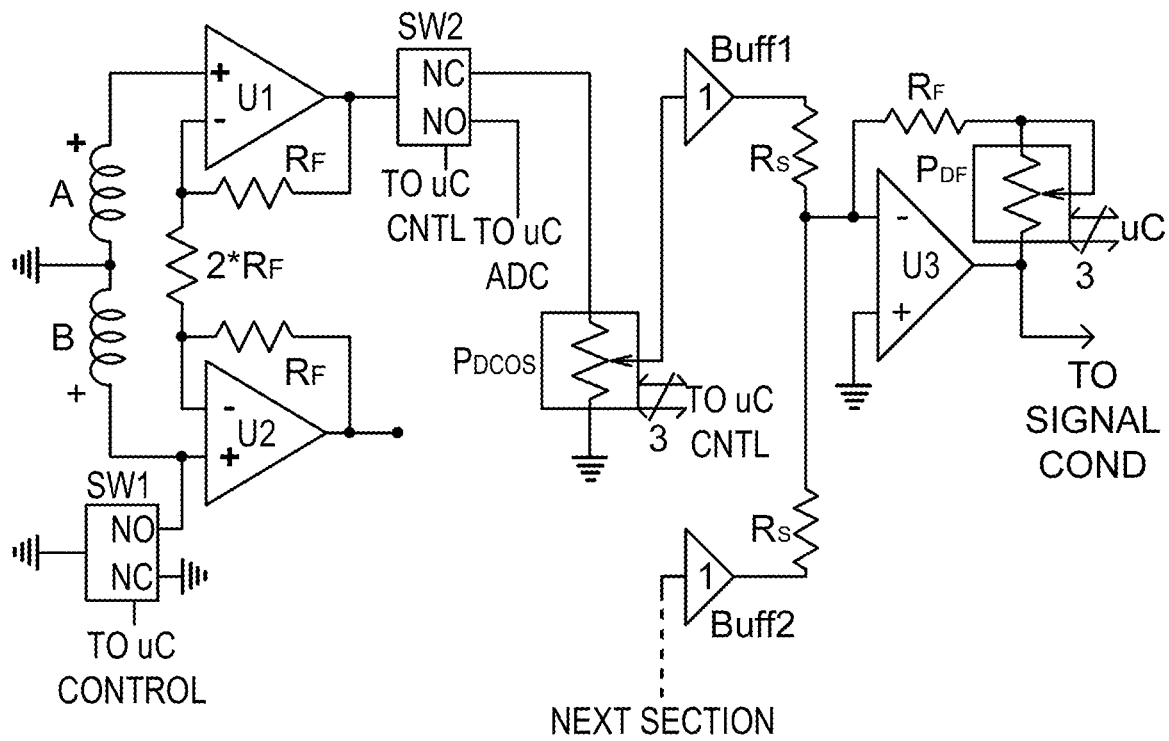
FIG. 5 shows FIG. 22 from Non-provisional patent application Ser. No. 15/156,509, also related to FIG. 23 in Non-provisional patent application Ser. No. 16/985,863, primarily to show how to make a programmable variable gain with the circuit elements attached to U3.

FIG. 5 shows FIG. 22 from U.S. Non-provisional patent application Ser. No. 16/156,509, mainly to show how the circuit components U3, RS, RF and PDF form a digitally-controlled gain amplifier, with the gain running from RF/RS to (RF+PDFMAX)/RS. A reasonable gain range for this application would be ½ to 2, allowing the different signal outputs of the pickup circuit to be equalized in volume with each other under the programming of a micro-controller or other micro-processor.

Figure 6:
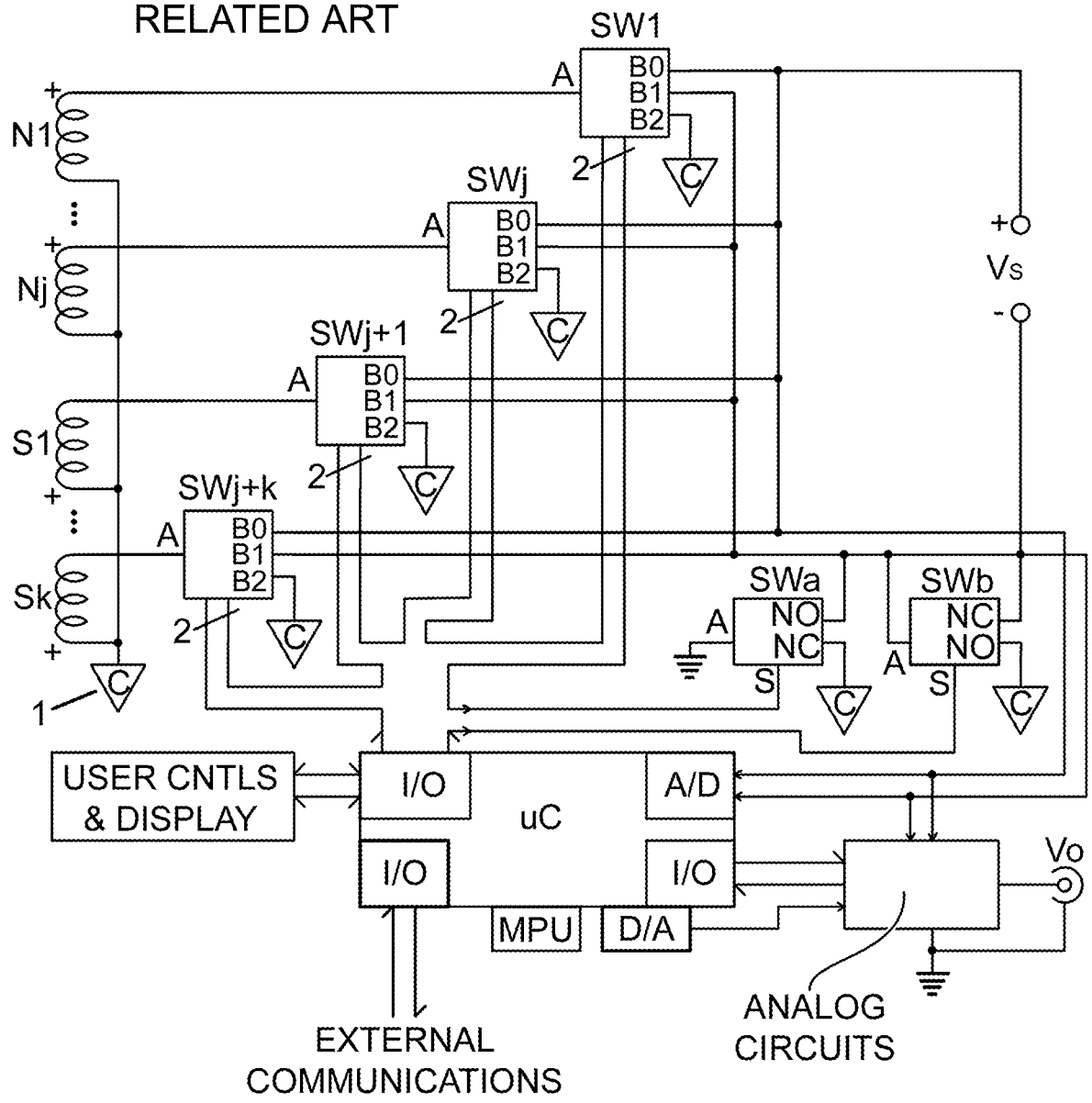
FIG. 6 shows FIG. 17 from U.S. Pat. No. 10,380,986, to demonstrate a way to use a micro-controller and solid-state analog switches to control any number (N=j+k>1) of matched single-coil pickups.

FIG. 6 shows FIG. 17 from U.S. Pat. No. 10,380,986, showing a micro-controller (uC) and analog-digital switches from FIG. 4 can be used to control the switching for J number of matched single-coil pickups with N-up poles (N1 to Nj) and K number of matched single-coil pickups with S-up poles (S1 to Sk), all connected with the same hum phase at a common point (Triangle-C). By following the rules in U.S. Pat. No. 10,380,986, it can produce all-humbucking outputs. The rules state that at least one pickup each must be connected to the switch circuit outputs, Vs+ and Vs−, and that either the common-point can be grounded or one of the outputs, Vs+ and Vs−, can be grounded, but not both. The pickup switches, SW1 to SWj+k, as shown in FIG. 3B, can connect the pickups to Vs+, Vs−, to the common point, or to nothing at all. Connecting a pickup to the common point shorts it out, which essentially has the same effect as connecting it to nothing. It is presented as an option merely because the switch allows it, and it may prove useful at some future time.

The uC includes various input-output (I/O) lines and ports and an analog-to-digital (A/D) converter, with an optional math processing unit (MPU) and digital-to-analog (D/A) converter. The ANALOG CIRCUITS block takes the analog-digital switch outputs which determine the pickup output signal, and in conjunction with the uC makes adjustments to the tone and gain. It would ideally include a volume pot on the output and at least one tone pot. SWa grounds either the common-point connection (Triangle-C) or the low side of the switch circuit output (Vs−). When the common point is grounded, the switch circuit output can be differential; when Vs− is grounded, the output is single-ended. SWb either does or does not connect the low side of the switch circuit output, Vs−, to the common point. When the common-point connection is connected to Vs−, it shorts out any pickups connected between the common point and Vs−. In this case, it allows for non-humbucking pickup circuits and for circuits to test each pickup individually.

Figure 7:
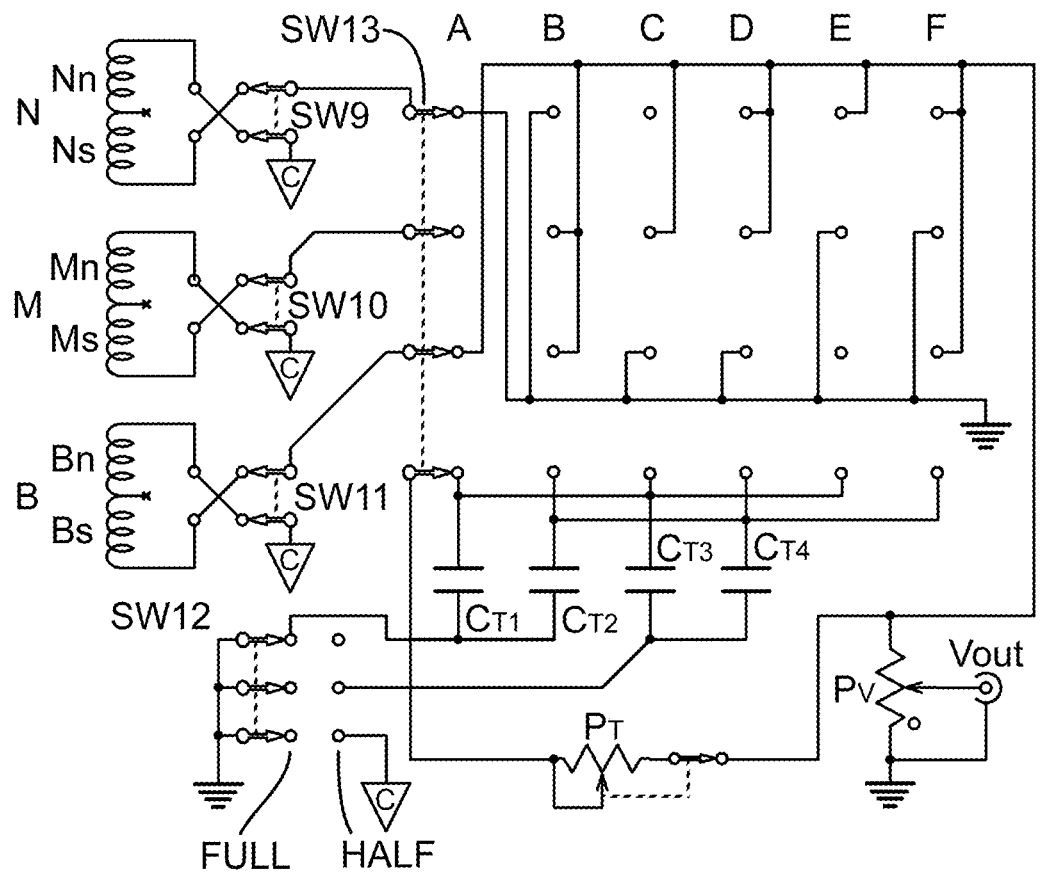
FIG. 7 shows modifications to FIG. 1 that allow three single-sized dual-coil humbucking pickups to simulate single-coil pickups with reversible magnets, by using lead-reversing switches. It also shows a better compensation for pickup circuit output impedance in switching the tone capacitor value.

FIG. 7 shows the all-mechanical embodiment of this invention. It modifies FIG. 1 by replacing all three matched single-coil pickups with dual-coil humbuckers, labeled B for the bridge position, M for the middle position and N for the neck position. The dual coils, with their magnetic poles up towards the strings are shown, with the center-tap not connected in the circuit. The mode switches, SW9, SW10 & SW11, each independently reverse the signal phase of the respective pickup for the switches in the right-hand position, as shown. They also effectively simulate reversing the magnets in three matched single-coil pickups, making this circuit useful in determining if it is desirable to construct matched single-coil pickups with reversible magnets. The mode switch, SW12 either selects the tone capacitors, $C_{T1}$ & $C_{T2}$, in the left or FULL position, or selects the tone capacitors, $C_{T3}$ & $C_{T4}$, in the HALF position and grounds the common-point. For all the SW9-11 mode switches in the left position, Table 2 shows the outputs of SW13 for SW12 in the FULL and HALF positions.

TABLE 2

Outputs at Vo in FIG. 7 for SW12 and SW13 settings, where B, M & N represent the string signals for the bridge, middle and neck pickups.

| SW13 | A | B | C | D | E | F |
|---|---|---|---|---|---|---|
| SW12 Left Pos FULL | B − N | (B + M)/2 − N | M − B | (N + M)/2 − B | N − M | (N + B)/2 − M |
| SW12 Right Pos HALF | B | (B + M)/2 | M | (M + N)/2 | N | (N + B)/2 |

FIG. 8 shows alternative connections for $P_T$, SW12 and the tone capacitors $C_{T1-4}$, which are more efficient in wiring SW13. But when the on-off switch on $P_T$ is open, it could allow the injection of noise signal into the output, if the entire circuit inside the guitar body does not have a grounded shield. Looking ahead, SW20 in FIG. 9 inverts the entire output, for the case that the output circuits include non-symmetrical, nonlinear distortion modes. Although not shown in FIGS. 7 & 8, that can be done here with a simple 2P2T switch.

To restate this, consider what happens when the modes switches SW9-11 are changed. Let "0" represent the left-wise non-inverted position for each switch and "1" the right-wise inverted position for each switch, and the number (0,0,0) denote the non-inverted positions for switches SW9, SW10 & SW11, respectively, producing non-inverted signals denoted by (B,M,N). Now increase the number 0,0,0 by 1 each in binary fashion, i.e., 000, 001, 010, 011 and 100. Underline as a duplicate any signal already found above it. Table 3 shows the results.

TABLE 3

Outputs at Vo in FIG. 7 for SW12 and SW13 settings, where B, M & N represent the string signals for the bridge, middle and neck pickups, for SW9-11 settings from (0, 0, 0) to (1, 0, 0) in binary progression. Underlined results are duplicates of those already produced above (in BOLD), in a linear system, assuming that the human ear cannot tell the different in a merely inverted signal. Note that only 21 distinct tonal circuits are shown in bold.

| SW13 | A | B | C | D | E | F |
|---|---|---|---|---|---|---|
| 0, 0, 0 FULL | B − N | (B + M)/2 − N | M − B | (N + M)/2 − B | N − M | (N + B)/2 − M |
| 0, 0, 0 HALF | B | (B + M)/2 | M | (M + N)/2 | N | (N + B)/2 |
| 0, 0, 1 FULL | B + N | (B + M)/2 + N | M − B | (−N + M)/2 − B | −N − M | (−N + B)/2 − M |
| 0, 0, 1 HALF | B | (B + M)/2 | M | (M − N)/2 | −N | (−N + B)/2 |
| 0, 1, 0 FULL | B − N | (B − M)/2 − N | −(M + B) | (N − M)/2 − B | N + M | (N + B)/2 + M |
| 0, 1, 0 HALF | B | (B − M)/2 | −M | (−M + N)/2 | N | (N + B)/2 |
| 0, 1, 1 FULL | B + N | (B − M)/2 + N | −(M + B) | (−N − M)/2 − B | M − N | (B − N)/2 + M |
| 0, 1, 1 HALF | B | (B − M)/2 | −M | −(M + N)/2 | −N | (−N + B)/2 |
| 1, 0, 0 FULL | −B − N | (−B + M)/2 − N | M + B | (N + M)/2 + B | N − M | (N − B)/2 − M |
| 1, 0, 0 HALF | −B | (−B + M)/2 | M | (M + N)/2 | N | (N − B)/2 |

Note that in the HALF mode in Table 2, the signal outputs are those to the left of the minus sign in the FULL mode. If SW10 were in the reversed position, then Table 2 would look like Table 1. Starting from the premise that the human ear cannot tell the difference in inverted signals without a separate signal reference, U.S. Pat. No. 10,217,450 held that for J number of pickups there can be only $2^{J-1}$ signal sign reversals with audibly different tones. This should hold true in any linear system of signals, or in any non-linear system, where there are no asymmetrical nonlinearities, such as half-wave rectifier or maybe a tube amp. If for some reason, the human ear is nonlinear enough, it might detect the difference. If not, then this principle shows that of three switches, SW9-11, only two are needed to reach the full range of tones.

So for outputs of single pickups in a linear system, we can only have signal equivalents of B, M and N, a total of 3. For outputs of humbucking pairs, or two pickups in series, we can have signal equivalents of B±N, B±M and M±N, a total of 6. For humbucking triples, we can have signal equivalents of B±(M±N)/2, M±(B±N)/2 and N±(B±M)/2, a total of 12. Note for the choice of (1,0,0), every choice has already been produced, and that (1,0,0) is the inverse of (0,1,1). The switches SW9 to 13 have throws of 2, 2, 2, 2 and 6 for a total of 96 switch combinations, which can only produce 21 functionally or tonally different circuits in a linear system. If we drop SW11, we still have 48 switch combinations with 21 distinct equivalent tonal circuits. Even if the switch combinations could be limited to just 21, previous experiments show that the tones tend to bunch at the warm end. It may be that not every human ear could hear the differences in all 21 tones, but it will be significantly more than the 3 or 5 that most electric guitars offer, and they will all be humbucking.

For future reference, consider a moment how humbucking triples work with reversible magnets or signals. If we expand all the possibilities of A±(B±C)/2, we get A+(B+C)/2, A+(B−C)/2, A+(−B+C)/2 and A−(B+C)/2. If we expand all the possibilities of A+(±B±C)/2, we get A+(B+C)/2, A+(B−C)/2, A+(−B+C)/2 and A+(−B−C)/2=A−(B+C)/2, the same set. Instead of writing a full table, we could have calculated the total number of possibilities. Note that the expression A±(B±C)/2 has two parts with different coefficients, 1 and ½. We calculate the number of ways to combine A, B and C in the expression by combinatorial math, either taking A first, as in (3 things taken 1 at a time) times (2 things taken 2 at a time)=3, or taking (B±C) first, as in (3 things taken 2 at a time) times (1 thing taken 1 at a time)=3, the same results. Then, following U.S. Pat. Nos. 10,217,450 and 10,380,986, we calculate the effect of reversing signals on J number of pickups as $2^{J-1}$. In this case $2^{3-1}$=4. So the answer is 3*4=12 total tonal circuit combinations with humbucking triples and reversible magnets or signals. This has not yet been fully developed beyond 5 pickups, where things get a bit more esoteric and confusing. But it's a decent starting point.

When mode switch SW12 is in the FULL position, the $4^{th}$ pole of pickup switch SW13 chooses either $C_{T1}$ or $C_{T2}$ for a tone capacitor. When SW12 is in the HALF position, SW13 chooses either $C_{T3}$ or $C_{T4}$ for a tone capacitor. Here's why. Let the inductance of a pickup be represented by Lp. For SW12 in the FULL position, SW13 chooses $C_{T1}$ at all the positions where the signal output comes from two pickups in series, with a total inductance of 2Lp. It chooses $C_{T2}$ for all the positions using a single pickup in series with two pickups in parallel, with a total inductance of 1.5Lp. For SW12 in the HALF position, SW13 chooses $C_{T3}$ for all the outputs with just one pickup, for a total inductance of Lp, and $C_{T4}$ for all the outputs with two pickups in parallel, for a total inductance of 0.5Lp.

There is a common misperception that circuits with two pickups in series produce warmer tones than circuits with two pickups in parallel. Not so. When the circuits are not loaded with other circuit elements, they produce the same tones, at different levels of signal output. For this reason, and the linear audio equivalence of inverted signals, the entries in Table 3 of B−N, (−N+B)/2 and (N−B)/2 are all counted the same. The difference only comes when the pickup circuits are loaded by attaching other components, such as pots and tone capacitors. A pickup is generally modeled as a signal voltage source (the electromagnetic effect of vibrating strings) in series with a resistor and an inductor. A resistor has no reactive effect to frequency and affects all tonal frequency components equally. An inductor has a reactance that increases linearly with increasing frequency, and opposes the passage of higher frequencies. A capacitor has a reactance that decreases inversely increasing frequency, and passing higher frequencies more easily, and opposing the passage of lower frequencies. A tone capacitor effectively shorts the higher (brighter) frequencies of the pickup circuit to ground.

If the tone capacitor is small, it effectively forms a resonant circuit with the inductance of the pickup circuit, and produces a peak in frequency, above which the tones fall of very quickly with increasing frequency. For the usual tone capacitors, this peaking effect is generally small, leaving only the rapid drop in higher frequencies. The tone pot moderates this, keeping the capacitor from shorting out the higher frequencies as its resistance increases, providing a control on the effect. The use of four tone capacitors for the four pickup circuits with different inductances allows this invention to remove most of the differences in the reduction of higher frequencies, leaving the differences in the individual contributions of each pickup, normal or inverted in signal, most prominent.

Assume that one wishes the high frequency roll-off to begin at the frequency of the $12^{th}$ fret of string 1 in standard EADGBE tuning on an electric guitar, or about 659 Hz. Call this frequency $f_{LOWPASS}$ or $f_{LP}$. Ignoring the effects of the tone and volume pots, the frequency of the low-pass or roll-off point is determined by $(2\pi f_{LP})^2 L C_T=1$, or $C_T=1/[(2\pi f_{LP})^2 L]$, where L is one of $0.5L_P$, $1.5L_P$ or $2L_P$ for $C_{T4}$, $C_{T3}$, $C_{T2}$ and $C_{T1}$, respectively. If, for example, $L_P$=5H and $f_{LP}$=659 Hz, then $C_{T1}$=0.0058 uF, $C_{T2}$=0.0078 uF, $C_{T3}$=0.012 uF and $C_{T4}$=0.023 uF, to get the same low-pass frequency for all the circuits. Because the tone pot, $P_T$, is fixed in total value, there will be some small differences in the rate the chosen tone capacitor takes effect as the tone pot is turned.

If we ignore the cancellation effects of out-of-phase components in many of the outputs in Table 3, and assume that all the pickups are magically sitting in the same position under the strings, the basic signal output strengths are Vs for one pickup, Vs for two pickups in parallel, 2Vs for one pickup in series with two in parallel and 2Vs for two pickups in series. In FIG. 7, all the effects on signal amplitude must be corrected by manually adjusting the volume pot, $P_V$.

Figure 9:
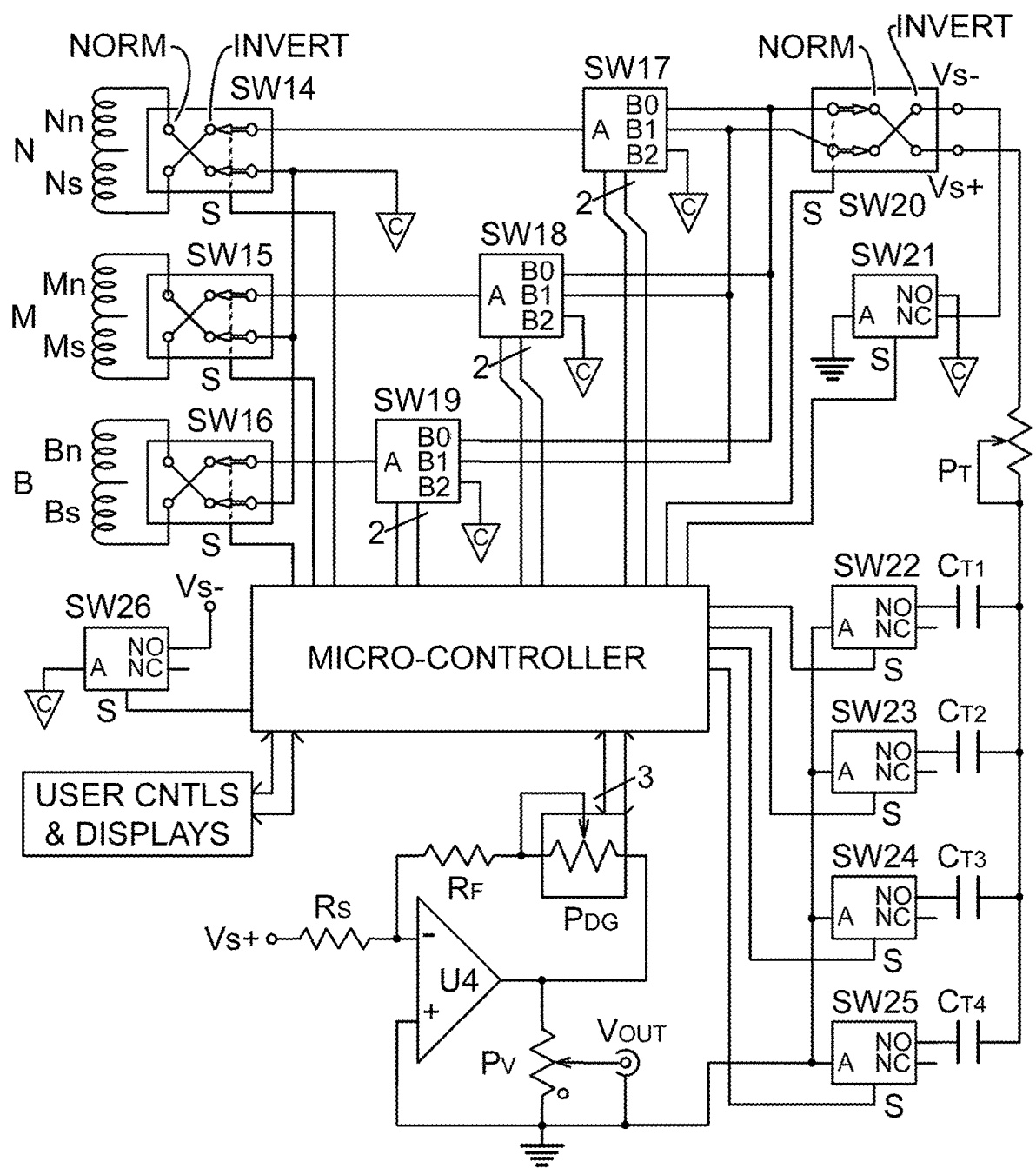
FIG. 9 shows FIG. 4 modified to use a uC to: 1) eliminate in programming the 96-54=42 duplicate circuits produced by mechanical switching; 2) to order the circuits according either to tone or user preference by programming; 3) to switch a number of tone capacitors in parallel to adjust for changes in circuit output inductance; and 4) by logical extension and circuit expansion, allow more than 3 pickups to be used in the circuit.

FIG. 9 shows a version of a combination of FIGS. 6 & 7 with all the electromechanical switches replaced by digitally-controlled analog switches, driven by a micro-controller (uC), programmed to provide an equivalent and efficient functionality to the user via programming and user controls and displays. Switches SW14-16 replace switches SW9-10. Switches SW17-19 replace SW13 and SW 22-25 replace switch SW12. Here, Vs+ replaces the circuit output in FIG. 7, and Vs− is normally grounded through SW21. Switches SW20 and SW21 are optional, with SW21 allowing the switch between single-ended and differential outputs. SW20 performs a total signal inversion of the switched pickup signal, Vs±, in the event that one or more non-symmetrical, non-linear distortion circuits should be added to the output, and need an inversion to achieve a full range of tonal choice. SW26 can ground the common-point connection, and provide for single-pickup outputs.

The digitally-controlled gain amplifier, comprised of Rs, $R_F$ $P_{DG}$, and U4, preferably has a gain, G, in the range of about −½ to −2, where $G=(R_F+P_{DG})/R_S$. The digital gain pot, $P_{DG}$, is analog, requiring 3 lines of I/O control on the micro-controller. Since this amplifier has a single-ended input, SW21 is not strictly necessary here, and the circuit will work just as well with Vs− grounded. This amplifier is meant only to equalize the signals from the 21 possible distinct outputs of the switching system, within the range allowed by the system analog supply voltage range. The master volume pot, $P_V$, and the tone pot, $P_T$, are set manually.

This circuit shows 19 lines of digital I/O connected to the uC, plus whatever is needed for the USER Controls and Displays. As shown before, only two of SW14-16 are really needed, SW20 is optional, and SW21 isn't has only one valid state (ground connected to Vs−) in this circuit. So the true number is more like 16 lines plus USER lines. This circuit does not pretend to the full functionality of FIG. 6 (FIG. 17 from U.S. Pat. No. 10,380,986); it is not intended to produce any ordering of tones based on Fast Fourier Transforms measured from signal outputs. It only intends to replace the basic functionality and limitations of electromechanical switches, but can be programmed for the user to set the order of switching. So the uC does not have any analog inputs or outputs, just digital I/O. This can use a uC without floating-point math. Nevertheless, the full spectral-measurement functionality of FIG. 6 is possible with the choice of the right uC.

Since Baker lost most of his skills in assembly-language and higher-level computer programming with age and medications, no flow charts or programming models are presented here. That will be left to others. Nevertheless, one does not forget everything. Electronic system architecture demands different skills, and this architecture is still practical, useful and efficient at implementing pickup switching. The flow chart for setting up a user preference for tonal circuit order is as old as a mechanical car radio station preset system.

For a system with 3 pickups, the USER DISPLAY can as simple as a two-character alphanumeric display that clearly identifies each of the 21 possible switching arrangements, with a third character for their inverses if found necessary. It could, for example, use the symbols S1 to S3 for the single-pickup signals produced in the HALF mode in FIG. 8, P1 to P6 for the tones using a pair of pickups, and T1 to T9, with TA, TB and TC for the 12 tones using three pickups. The USER CONTROLS can be as simple as one mode switch, either push-button momentary contact or an up-down toggle switch, which cycles through the modes, plus a selection switch using an up-down toggle switch. The modes can be as follows: 1) Select Circuit, where the selection switch moves through the circuit outputs, and shows them on the display; 2) Change Position, where the selection switch moves the selected circuit up or down in the order of switching output; and 3) Play Selection, where the selection switch moves up or down in the order of output and selects the pickup circuit to play.

Alternatively, the Play Selection mode could enable a third switch, like a mouse wheel or rotary switch, which sends up-down signals to the uC to change the circuit being played. In this alternative, the circuit selection switch could be separated from the mode and ordering switches, so that the circuit order doesn't get changed by accident while playing, and can be done by the user's memory. Many players will have only a few favorite tonal circuits. In this way, they can line them up in any order they desire, and play just them without bothering with the other tonal circuits. Following the general expansion of circuits shown in FIG. 6, the circuits in FIGS. 7, 8 & 9 can be scaled up or down any number greater than 1 pickup, and still follow the rules for common-point connection circuits. But finding the switches for four pickups to make FIG. 8 work as expanded would be an expensive challenge.

Figure 10A:
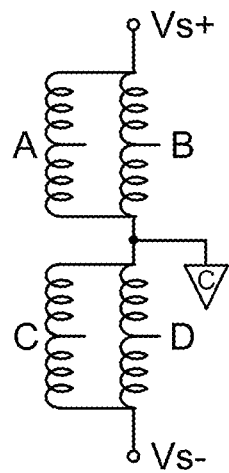
FIG. 10A-B show the two four-pickup common-point humbucking circuits developed in U.S. Pat. No. 10,380,986 (Column 13, Table 3) that can be used in FIG. 9 with four single-sized dual-coil humbucking pickups, A, B, C & D.
Figure 10B:
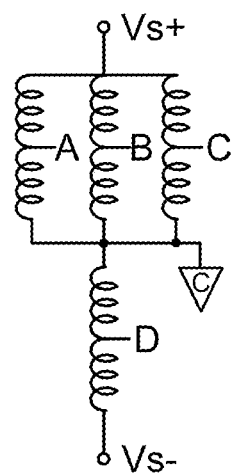

FIG. 10A-B shows the two versions of common-point connection circuit for four dual-coil humbucking pickups, as developed in U.S. Pat. No. 10,380,986 (Column 13, Table 3), in the context of this invention. Without reversible magnets or signals, due to duplications from circuit symmetry, for FIG. 10A, there are only three tonal output combinations of the pickups A, B, C & D: (A+B)/2−(C+D)/2, (A+C)/2−(B−D)/2 and (A+D)/2−(B+C)/2. All other combinations produce merely inverted signals of these three. There are also only four combinations of pickups for circuit in FIG. 10B: (A+B+C)/3−D, (A+B+D)/3−C, (A+C+D)/3−B and (B+C+D)/3−A. This would suggest only 7 distinct tonal circuits.

But throw in reversible signals and things change a bit. We can write the first combination of 4 pickups as: $(A\pm B\pm C\pm D)/2$, which is (4 things taken 4 at a time) times $(2^{4-1})=1*8=8$. We can write the second combination of 3 in parallel, all in series with 1, as $A\pm(B\pm C\pm D)/3$. Then calculate the total number of combinations as (4 things taken 1 at a time) times $(2^{3-1})=4*8=32$. So for combinations of all four pickups in these two common-point connection configurations, the total number of distinct tonal circuits is 8+32=40. But let's not get carried away just yet. "Distinct" in this case means that in each circuit the pickups have distinctly different combination of contributing proportions at the output. And 4-coil experiments have shown that, for a measure of tone as the average spectral frequency of six strummed and unfretted strings, many of the tones tend to bunch together at the warm end. There may be less humanly audible distinct tones than the numbers suggest.

If one has four pickups, A, B, C and D, this also increases the number of possible circuits of 2 and 3 pickups each. Reconsider the discussion following Table 3. There are 4 possible single pick circuits in HALF mode: A, B, C & D, each with a total inductance of Lp. The pairs are $A\pm B$, $A\pm C$, $A\pm D$, $B\pm C$, $B\pm D$ & $C\pm D$, 12 circuits with a total inductance of either 0.5Lp or 2Lp, depending on whether they are in parallel (HALF mode) or series (FULL mode), respectively. The 12 triples from Table 3 are multiplied by (4 things taken 3 at a time)=4 to get 48 circuits, all with a total inductance of 1.5Lp. The 8 circuits from FIG. 10A have a total inductance of 2Lp, and the 32 circuits from FIG. 10B have a total inductance of (4/3)Lp. In the HALF mode, the circuits in FIG. 10A merely duplicate preceding pairs, but the circuits in FIG. 10B offer these combinations: $(A\pm B\pm C)/3$, $(A\pm B\pm D)/3$, $(A\pm C\pm D)/3$ and $(B\pm C\pm D)/3$. Calculations then give us (4 things taken 3 at a time) times $(2^{3-1})=4*4$, a total of 16 combinations, all with an inductance of Lp/3.

So, if there are no math errors, by adding one pickup and one switch each like SW14 and SW17, in the same contexts, we get 4+12+48+8+32+16=120 tonal circuits, with a range of inductances including Lp/3, Lp/2, Lp, 4Lp/3, 3Lp/2 and 2Lp. This might require adding 2 more switches like SW22 and 2 more tone capacitors to maintain the same functions. But with judicious choices of capacitors, parallel combinations of two or more of the tone capacitors $C_{T1-4}$ might fill the need close enough.

For two pickups A and B, we can have just the two signals A+B and A−B in this system. For three pickups, we have identified 21 tonal circuit and for four, 120 tonal circuits. One can extend this to five or more such pickups, and the number of possible tonal circuits tends to increase exponentially with the number of pickups. At some point there are diminishing returns, since prior research indicates that the tones tend to bunch together at the warm end, with adjacent tones becoming more indistinguishable with more pickups. This might work a lot better with pickups on pianos, which can fit more under piano strings, compared to the small area on a guitar between the neck and bridge.

For 5 pickups with reversible magnets or signals, we have 5 single-pickup outputs. For pairs, $(A\pm B)$, we have (5 things taken 2 at a time) times $(2^{2-1})=10*2=20$ distinct circuits. For triples, $A\pm(B\pm C)/2$, we have (5 things taken 1 at a time) times (4 things taken 2 at a time) times $(2^{3-1})=5*6*4=120$ distinct circuits. For HALF mode triples, $(A\pm B\pm C)/3$, we have (5 things taken 3 at a time) times $(2^{3-1})=10*4=40$ distinct circuits. For the first kind of circuit of 4 pickups above, $(A\pm B\pm C\pm D)/2$, we have (5 things taken 4 at a time) times $(2^{4-1})=5*8=40$ distinct circuits. For the second kind of circuit of 4 pickups above, $A\pm(B\pm C\pm D)/3$, we have (5 things taken 1 at a time) times (4 things taken 3 at a time) times $(2^{4-1})=5*4*8=160$ distinct circuits. So for combinations of 5 pickups in smaller common-point circuits, we have 5+20+120+40+40+160=385 distinct circuits, barring any math errors.

In U.S. Pat. No. 10,380,986, two different type of 5-pickup circuits were found for common-point connection systems: (A+B+C)/3−(D+E)/2 and (A+B+C+D)/4−E. For this discussion, we can write them as: (A±B±C)/3±(D±E)/2 and (A±B±C±D)/4±E. From the first, we have (5 things taken 3 at a time) times (2 things taken 2 at a time) times $(2^{5-1})=10*16=160$. From the second, we have (5 things taken 4 at a time) times (1 thing taken 1 at a time) times $(2^{5-1})=10*16=160$. Note that in the HALF mode, the second form produces another 4-pickup set, (A±B±C±D)/4, but this has the same tones as (A±B±C±D)/2 from before. So the total number of common-point connection circuits with reversible signals for 5 pickups is 385+160+160=705. But it is highly probable that many of these tones will sound a lot alike. And there is no practical mechanical switching system that can fit under a pickguard to produce them. It will take a system of digitally-controlled solid-state analog switches, expanded from that shown in FIG. 9. Nevertheless, it beats a 5-way switch.

Obviously, with 4 pickups and 120 possible circuits or 5 pickups and 705 possible circuits, the User Display in FIG. 9 must have more display characters and circuit designations. It would be advisable to have at least two sets of circuit designations, one with alpha-numeric characters for the pickup combinations, another with a binary display for the signal reversals and perhaps another for the order of the combination in the user's preferred sequence.

The invention claimed is:

1. A sensor switching system for a musical instrument, comprised of:
   a. two or more humbucking dual-coil electromagnetic vibration sensors, each with two output terminals, having a phase-reversing two-pole, two-throw mode switch, connected to said sensor output terminals, which mode switch has a first throw which connects said sensor output terminals to the rest of said sensor switching system without reversal, and a second throw which connects said sensor output terminals to the rest of said sensor switching system reversed; and
   b. a common connection point, to which all of all of said sensors are connected by the low output terminal of theft mode switches, distinct from a circuit reference ground; and
   c. a sensor switching circuit, using the outputs of said sensor mode switches as inputs, producing from them a further signal output, with high and low signal output terminals, which
   i. is comprised of:
   1. a sensor connection switch of multiple poles and multiple throws, which has at least as many poles as there are sensors; and:
      a. creates circuits of two or more of said sensors to produce output signals by connecting at least one sensor to the high signal output terminal and at least one sensor to the low signal output terminal; and
      b. uses one or more poles not used for sensor signals to create circuits of one or more passive components to modify, said output signals; and
   2. one or more mode switches, each of at least one pole and at least two throws, used to change an effective operation of said sensor connection switch and output signals, including:
      a. to choose whether to short said common-point connection to the low output terminals of said sensor switching circuit, so as to present only the sensors connected between it and the high output terminal as the output of said sensor switching circuit; and
      b. to choose between sets of passive components, in conjunction with said sensor connection switch, to modify the signal output of said sensor switching circuit output; and
      c. to reverse a phase of the output of said sensor switching circuit before it connects to said passive components; and
   ii. connects said system reference ground to either said common connection point or said low signal output terminal; but not both in normal operation, except for cases of circuit testing.

2. The invention as recited in claim 1, wherein one or more of said switches are digitally-controlled analog switches, instead of electro-mechanical switches themselves controlled by a micro-controller or micro-processor, with internal programming and user controls and displays sufficient to control switching functions.

3. An embodiment of said switching system as recited in claim 1, wherein:
   a. one or more poles of said sensor connection switch is part of one or more capacitor-potentiometer tone circuits at the output of said switching system, and the throws associated with said poles change capacitance so that an intrinsic output high-frequency roll-off due to the combination of a capacitance and a pickup lumped circuit inductance of each throw is compensated to be roughly equal for each throw of said sensor connection switch; and
   b. said mode switches for grounding said common-point connection have one or more additional poles to facilitate changing said capacitance when said mode switches select between the grounded and ungrounded states of said common-point connection.

4. An embodiment of said switching system as recited in claim 1, wherein a number of said signal reversing mode switches for J number of sensors is limited to J−1, leaving one and only one sensor without a signal reversing mode switch, which mode switches may be either electro-mechanical switches or digitally-controlled solid-state analog switches.

5. An embodiment of said switching system as recited in claim 1, wherein a mode switch at high and low outputs of said sensor connection switch reverses the phase of an output signal, which mode switch may be either an electro-mechanical switch or a digitally-controlled solid-state analog switch.

6. An embodiment of said switching system as recited in claim 1; wherein: digitally-controlled solid-state analog switches control one or more capacitor-potentiometer tone circuits at the output of said switching system, changing a tone circuit capacitance so that an intrinsic output high-frequency roll-off due to the combination of the capacitance and a pickup lumped circuit inductance of different pickup circuits are adjusted, to maintain a same roll-off frequency for each said pickup circuit.

7. An embodiment of said switching system as recited in claim 2, wherein digitally-controlled solid-state analog switches replace electro-mechanical mode switches, electro-mechanical tone capacitor switches and sensor connection switches, wherein:

a. each sensor has a 2P2T solid-state switch to reverse its signal to the rest of the circuit, or each sensor except one has a 2P2T solid state reversing switch; and
b. a designated low output of each said 2P2T signal reversing switch is connected to said common-point connection, and another output, designated as high, passes to input poles of solid-state pickup connection switches; and
c. each said solid-state sensor connection switch has at least three states of output:
i. connected to a high side of a sensor circuit selection switching output; or
ii. connected to a low side of the sensor circuit selection switching output; or
iii. either connected to no output, for a three state output, or connected to the common-point connection with a 4-state output; and
d. a solid-state mode switch connects signal ground either to the low side of the sensor circuit selection switching output for single-ended output operation, or to the common-point connection for differential output operation; and
e. a set one or more of digitally-controlled solid-state mode switches, of at least one pole and one throw, are each connected to a tone capacitor, and under digital control in binary fashion either do or do not connect each associated tone capacitor in series with one or more tone potentiometers, each forming a resistive-capacitive tone circuit across the output of said switching system, so as to control the high-frequency roll-off of a composite output signal of said vibration sensors; and
f. a single solid-state mode switch either connects said common-point to the low output of the sensor circuit selection switching or does not, allowing the composite output signal of said switching system to be constrained to a combination of pickups connected in parallel between the common point and the high side of the sensor circuit selection switching.

8. An embodiment of said switching system as recited in claim 7, wherein a digitally-controlled solid-state signal reversing switch is interposed between said sensor circuit selection switches and the rest of said switching system.

9. An embodiment of said switching system as recited in claim 7, wherein the sensor circuit selection switching output is fed into a variable-gain output amplifier, which gain is set by a digitally-controlled linear potentiometer.

10. An embodiment of said switching system as recited in claim 7, wherein the programmable micro-controller or micro-processor has programming and user inputs and displays that fulfill these functions:
a. changing a sensor circuit used in said sensor circuit switching output; and
b. setting an order of output to a user-preferred sequence of all available possible sensor circuit combinations; and
c. setting a relative volume used with each sensor circuit; and
d, allowing test functions; and
e. allowing the programming of the micro-controller or micro-processor to be changed and updated.

11. An embodiment of said switching system as recited in claim 1, wherein tone circuits are connected individually to one or more of said sensors, being comprised of:
a. a fixed reactive element, and
b. a resistive element, connected:
i. in series with said reactive element, if said tone circuit is connected in parallel with a sensor, or
ii. in parallel with said reactive element, if said tone circuit is connected in series with a sensor, and
c. a means of disabling each said tone circuit from each associated said sensor, which is:
i. in series with said tone circuit, if it is in parallel with said sensor, or
ii. in parallel with said tone circuit, if it is in series with said sensor.

* * * * *